(12) United States Patent
Peng et al.

(10) Patent No.: US 9,041,421 B2
(45) Date of Patent: May 26, 2015

(54) IC, CIRCUITRY, AND RF BIST SYSTEM

(75) Inventors: Chun-Hsien Peng, Xinyi Township, Nantou County (TW); Pei-Wei Chen, Hsinchu (TW); Ping-Hsuan Tsu, Taipei (TW); ChiaYu Yang, New Taipei (TW); Chun-Yu Lin, New Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 302 days.

(21) Appl. No.: 13/480,969

(22) Filed: May 25, 2012

(65) Prior Publication Data

US 2013/0021048 A1 Jan. 24, 2013

Related U.S. Application Data

(60) Provisional application No. 61/496,451, filed on Jun. 13, 2011.

(51) Int. Cl.
*G01R 31/28* (2006.01)
(52) U.S. Cl.
CPC ........ *G01R 31/2822* (2013.01); *G01R 31/2884* (2013.01)

(58) Field of Classification Search
CPC ........... G01R 31/2822; G01R 31/2834; G01R 31/2843; G01R 31/2884; G01R 31/3167
USPC .............. 324/750.01, 750.02, 750.3, 750.15, 324/750.18
See application file for complete search history.

(56) References Cited

U.S. PATENT DOCUMENTS 7,679,391 B2 * 3/2010 Watanabe et al. .......... 324/750.3
2009/0201039 A1 * 8/2009 Wu et al. ..................... 324/754

* cited by examiner

*Primary Examiner* — Tung X Nguyen
*Assistant Examiner* — Alesa Allgood
(74) *Attorney, Agent, or Firm* — McClure, Qualey & Rodack, LLP

(57) ABSTRACT

An IC, a circuitry, and an RF BIST system are provided. The RF BIST system includes a test equipment, a module circuitry, and an IC. The IC is arranged to communicate with the module circuitry by an RF signal in response to a command signal from the test equipment, determine a test result by the RF signal, and report the test result to the test equipment, wherein the module circuitry is external to the IC and the test equipment.

17 Claims, 7 Drawing Sheets

IC, CIRCUITRY, AND RF BIST SYSTEM

CROSS REFERENCE TO RELATED APPLICATIONS

This Application claims priority of U.S. Provisional Application No. 61/496,451, filed on 13 Jun. 2011, and the entirety of which is incorporated by reference herein.

BACKGROUND OF THE INVENTION

1. Field of the Invention

The present invention relates to semiconductor devices, and in particular relates to radio frequency (RF) built-in-self-test (BIST) for semiconductor devices.

2. Description of the Related Art

Semiconductor devices are manufactured in the form of wafers comprising many thousands of devices. The wafers are diced into dies and packaged into integrated circuits (IC). Each IC has been implemented by integrating more and more digital and analog circuits in a single chip.

Due to the increasing complexity in the test of integrated RF circuits, to identify the "good" and "bad" ICs in the production is a challenging problem for wafer level test or final test. For traditional test of RF circuits, an expensive automatic test equipment (ATE) such as UltraFlex or Flex with RF instruments, or equipments of mixing signal is used for generating RF testing signal (or RF patterns) to a device under test (DUT) and processing RF signal coming out from the DUT, leading to increased test cost and test time. Therefore, an effective RF built-in self-test (RF-BIST) technique for transceivers is in need to solve the above problems.

BRIEF SUMMARY OF THE INVENTION

In one aspect of the invention, an integrated circuit (IC) is disclosed, comprising a test signal generator, a transmitter, and a test result analyzer. The test signal generator is arranged to generate a test signal in response to a command signal from an external test equipment. The transmitter is arranged to generate a radio frequency (RF) signal according to the test signal. The test result analyzer is arranged to determine a test result by the RF signal, and report the test result to the external test equipment.

In another aspect of the invention, an IC is provided, comprising a controller, a receiver, and a test result analyzer. The controller is arranged to make the IC enter a test mode in response to a command from an external test equipment. The receiver is arranged to receive an RF signal under the test mode. The test result analyzer is arranged to determine a test result by the RF signal, and report the test result to the external test equipment.

In yet another aspect of the invention, a circuitry is described, communicating with an integrated circuit using RF signals, comprising an input port, a signal evaluator, and an output port. The input port is configured to receive a first test result signal at an RF frequency. The signal evaluator is configured to be controlled by an external controller, and evaluate the first test result signal to determine an evaluation signal indicating an electrical characteristics of the first test result signal. The output port is configured to output the evaluation signal to the integrated circuit.

In still another aspect of the invention, an RF build-in-self-test (BIST) system is revealed, comprising a test equipment, a module circuitry, and an IC. The IC is arranged to communicate with the module circuitry by an RF signal in response to a command signal from the test equipment, determine a test result by the RF signal, and report the test result to the test equipment, wherein the module circuitry is external to the IC and the test equipment.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

A detailed description is given in the following embodiments with reference to the accompanying drawings.

Figure 1:
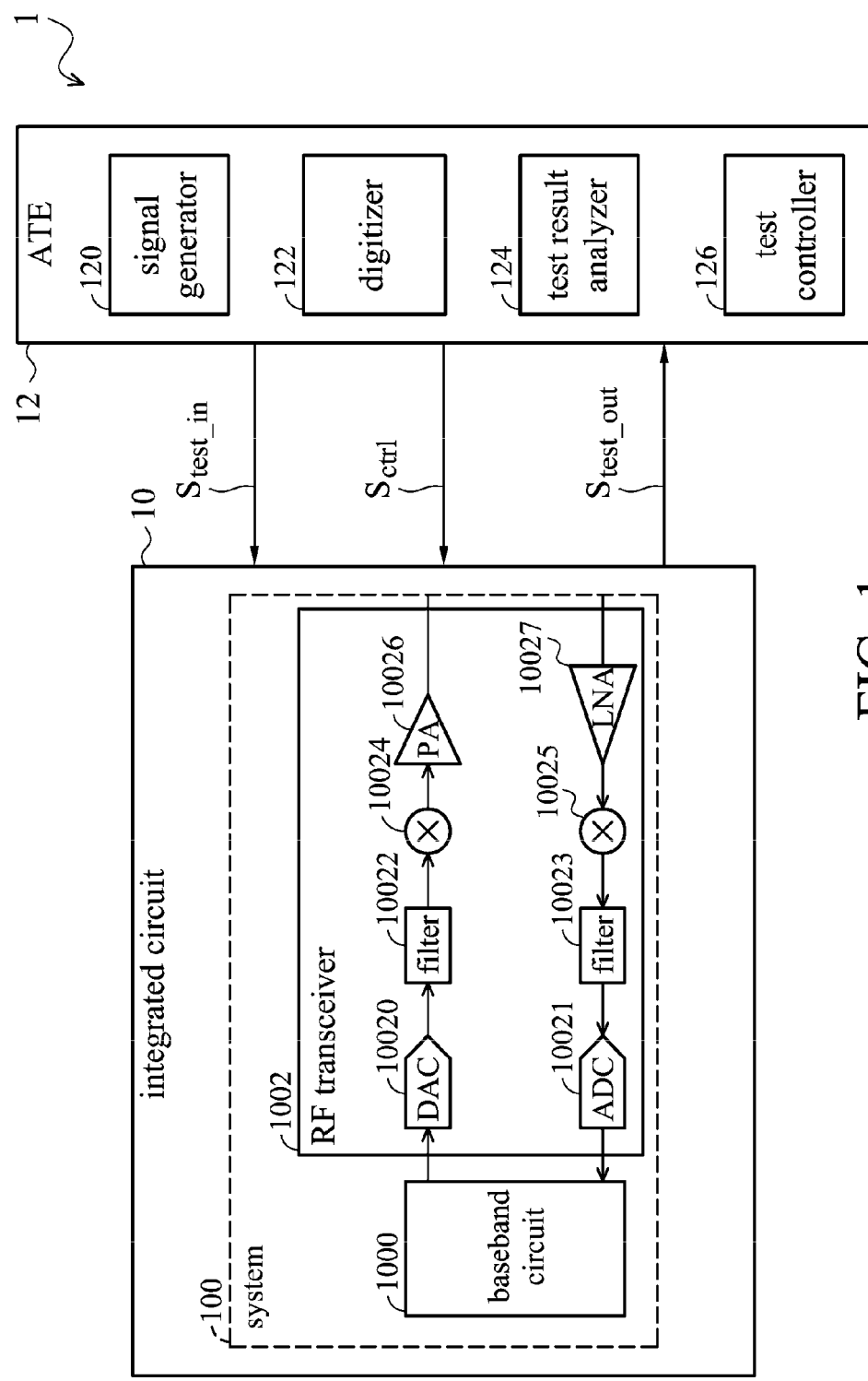
FIG. 1 is a block diagram of a conventional radio frequency (RF) test system 1.

FIG. 1 is a block diagram of a conventional radio frequency (RF) test system 1, comprising an integration circuit (IC) 10 and automatic test equipment (ATE) 12. The ATE 12 applies semiconductor testing for digital and analog elements in the IC 10 during the hardware manufacturing procedure. The IC 10 is a device under test (DUT) that receives power and testing patterns from the ATE 12 and outputs testing responses to the ATE 12. The ATE 12 is an electronic apparatus that receives a test program and performs tests accordingly on the DUT by supplying stimulus signals. The ATE 12 also receives outcome signals, takes signal measurements, evaluates test results based on the signal measurements, and determines whether the DUT is good or bad. The ATE 12 comprises a signal generator 120, a digitizer 122, a test result analyzer 124 and a test controller 126. The test controller 126 sends a test control signal $S_{ctrl}$ to control all the registers in the IC 10 by some digital or analog pins to operate under a test mode. The signal generator 120 may provide an analog signal or/and RF signal (test pattern $S_{test\_in}$) to be injected into the IC 10 for the test of RF circuits. The digitizer 122 digitizes an output response $S_{test\_out}$ from the IC 10 and converts analog signal to digital signal. The test result analyzer 124 analyzes the evaluated signal performance of the digitized signal to determine whether the DUT has any faulty component for wafer level test or final test.

The IC 10 in FIG. 1 includes system 100, which comprises a baseband circuit 1000 and an RF transceiver 1002. The ATE 12 performs an RF test to the IC 10, in particularly, to all transceivers for various communication systems adopted by the IC 10 by feeding the analog or/and RF test pattern $S_{test\_in}$ into the IC 10. System 100 illustrates a transmitter path and receiver path, wherein the transmitter path comprising a digital-to-analog converter (DAC) 10020, a filter 10022, a modulator 10024, and a power amplifier (PA) 10026, and the receiver path comprising a low noise amplifier (LNA) 10027, a demodulator 10025, a filter 10023, and an analog-to-digital converter (ADC) 10021. For an RF test, the signal generator 120 in the ATE 12 generates and injects a test pattern $S_{test\_in}$ in high frequency to a testing interface (not shown) for testing the RF receiver in the system 100. The ATE 12 may further receive analog or/and RF signal $S_{test\_out}$ from the output of the transmitter path to evaluate the quality of transmitter of the IC 10.

In the conventional RF test, the ATE 12 supplies the analog or/and RF test pattern $S_{test\_in}$ to the IC 10 and receives the analog or/and RF output response $S_{test\_out}$ from the IC 10, therefore there is high-speed communication between the ATE 12 and the IC 10, requiring the ATE 12 to work under a high speed, resulting in an increased cost of the ATE 12.

Figure 2:
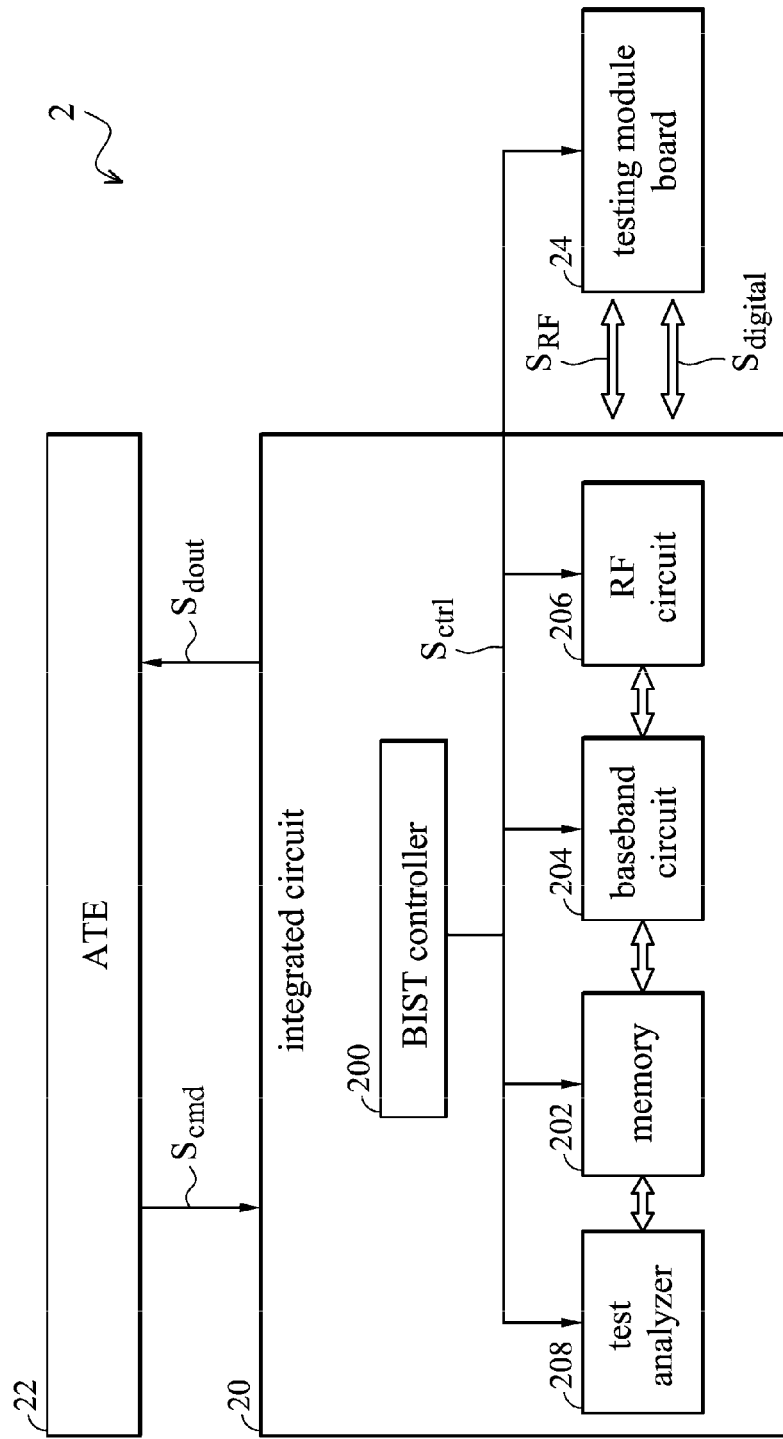
FIG. 2 is a block diagram of an RF built-in-self-test (BIST) system 2 according to an embodiment of the invention.

FIG. 2 is a block diagram of an RF BIST system 2 according to an embodiment of the invention, comprising an IC 20, an ATE 22, and a testing module board 24. The ATE 22 initializes an RF BIST by sending a command signal $S_{cmd}$ to the IC 20. In response, the IC 20 is arranged to enter into a test mode, and, in contrast to the ATE 22 controlling the test process in the conventional approach, the IC 20 takes controls of the test operations, which aims to locate defected building elements in a mixed mode circuitry or an analog circuitry in the IC 20. Under the test mode, the IC 20 communicates with the testing module board 24 using RF signals $S_{RF}$ and digital signals $S_{digital}$. The IC 20 may transmit RF signals $S_{RF}$ to the testing module board 24 for transmission performance evaluation or receive RF signals $S_{RF}$ from the testing module board 24, which is generated by the testing module board 24 itself or the IC 20 itself passing through the testing module board 24 using an external loopback path, to evaluate reception performance of the IC 20. The digital signals $S_{digital}$ may be an evaluation signal produced and sent by the testing module board 24 to the IC 20 for a test analysis. The testing module board 24 is external to the IC 20 and ATE 22, comprises discrete components thereon to assist signal property analysis as well as RF testing signal generation and receive a control signal $S_{ctrl}$ from the IC 20 in the test mode. In some implementations, an RF circuit 206 in the IC 20 may comprise RF transmitter to generate RF signal and RF receiver to receive RF signal from IC 20 itself by internal loopback path or testing module board 24. The quality of RF transmitter in RF circuit 206 may be evaluate by testing module board and/or IC 20 itself with a test analyzer 208 through internal or external loopback path. The RF receiver in RF circuit 206 also may be as a DUT to receive an RF signal from testing module board or IC 20 itself through internal or external loopback path and convert the RF signal to digital baseband signal. Consequently, the test analyzer 208 may be used to analyze captured digital signal saved in memory 202 and evaluate the quality of RF receive in RF circuit 206.

The ATE 22 is capable of initiating various RF BISTs to the IC 20, including a single tone or one-tone test, a two-tone test, a multi-tone test, a noise figure (NF) test, a lock time test, a modulation test, etc. The ATE 22 may send the command signal or digital pattern $S_{cmd}$ informing the IC 20 of the type of the BIST that is to perform, so that the IC 20 can load corresponding test patterns internally according to the command signal $S_{cmd}$. The ATE 22 may transmit the digital pattern $S_{cmd}$ initiating one or more RF BIST types to IC 20.

The IC 20 in FIG. 2, comprises a BIST controller 200, a test analyzer 202, a memory module 204, a baseband circuit 206, and an RF circuit 206.

The BIST controller 200 is internally coupled to the memory module 202, the baseband circuit 204, the RF circuit 206, and a test analyzer 208, and externally coupled to the testing module board 24 to take control of the test operations through the control signal $S_{ctrl}$. The control signal $S_{ctrl}$ is a baseband signal having a frequency close to zero, and may be in digital or analog form. The BIST controller 200 controls the testing module board 24 to operate under the test mode through the control signal $S_{ctrl}$.

The memory module 202 and the baseband circuit 204 may be implemented as a signal generator, which is programmed to sequentially perform various tests by producing and injecting the test patterns into the RF circuit 206 for the tests including the one-tone test, the two-tone test, the multi-tone test, the NF test, the lock time test, the modulation test, etc. In some implementations, the memory module 202 is also served as a temporary data storage for captured baseband signals from the baseband circuit 204 or RF BIST results from the test analyzer 208. The test analyzer 208 can be used to measure power at frequency associated with wanted tone, image tone or second-order or third-order harmonics to test transmitter/receiver gain, image rejection ratio (IRR), input second intercept point (IIP2), input third intercept point (IIP3), etc. In test analyzer 208, we can implement a noise power estimator to calculate noise power or signal-to-noise ratio (SNR) of receiver for NF test. The lock time measure can also be implemented by software or hardware in the test analyzer 208 to test the lock time of a phase-locked loop (PLL) which comprises the instantaneous frequency estimation, lock time calculation using the information of the frequency estimates, and pass/fail decision. Some estimators for modulated tests such as error vector magnitude (EVM) and spectrum estimators can also be implemented in the test analyzer 208 to evaluate the quality of RF transmitter in RF circuit 206.

The transmitter path is usually tested at the system level test by the EVM and spectrum, nonlinearity tests such as IIP2 and IIP3, an image signal test, a carrier leakage test, and a transmission power test. The evaluated characteristics for the receiver path comprise a receiver gain test, an image signal test, a DC offset test, NF test, and nonlinearity test such as IIP2 and IIP3.

The RF circuit 206 comprises building circuit elements for an RF transmitter and an RF receiver, including a DAC, an ADC, a filter, a modulator, a demodulator, a local oscillator, a PA, and an LNA. The BIST may be applied to test a single element or a circuit in the RF circuit 206 or whole transmission or reception path. The test analyzer 208 receives the evaluation signals from either the testing module board 24 or the RF circuit 206 to determine a test result signal $S_{dout}$ indicative of whether the DUT has passed or failed the test, and then reports the test result signal $S_{dout}$ to the ATE 22. The command signal $S_{cmd}$ and the test result signal $S_{dout}$ are baseband signals that are at a frequency substantially close to zero, and may be in digital or analog form.

In some implementations, the IC 20 can further comprise a compensator (not shown) to compensate or adjust parameters for the RF circuit elements 206 using digital or analog circuit based on evaluated characteristics of the captured digital signal in test analyzer. In comparison to the conventional RF approach, the present embodiment depicts an RF BIST system where the ATE 22 is only used to initiate the test and keep the test results. The RF BIST tasks including test pattern generation, signal analysis, and test result justification are now shifted to either the IC 20 or the testing module board 24. Consequently, circuit complexity of the ATE 22 can be reduced, thereby decreasing design and manufacturing cost of the ATE 22. Further, the testing module board 24 is included in the test to assist evaluation of the signal characteristics for the signature response, or loop back the transmitter response to the RF receiver. Thus, there are a high-speed communication $S_{RF}$ between the IC 20 and testing module board 24.

Figure 3:
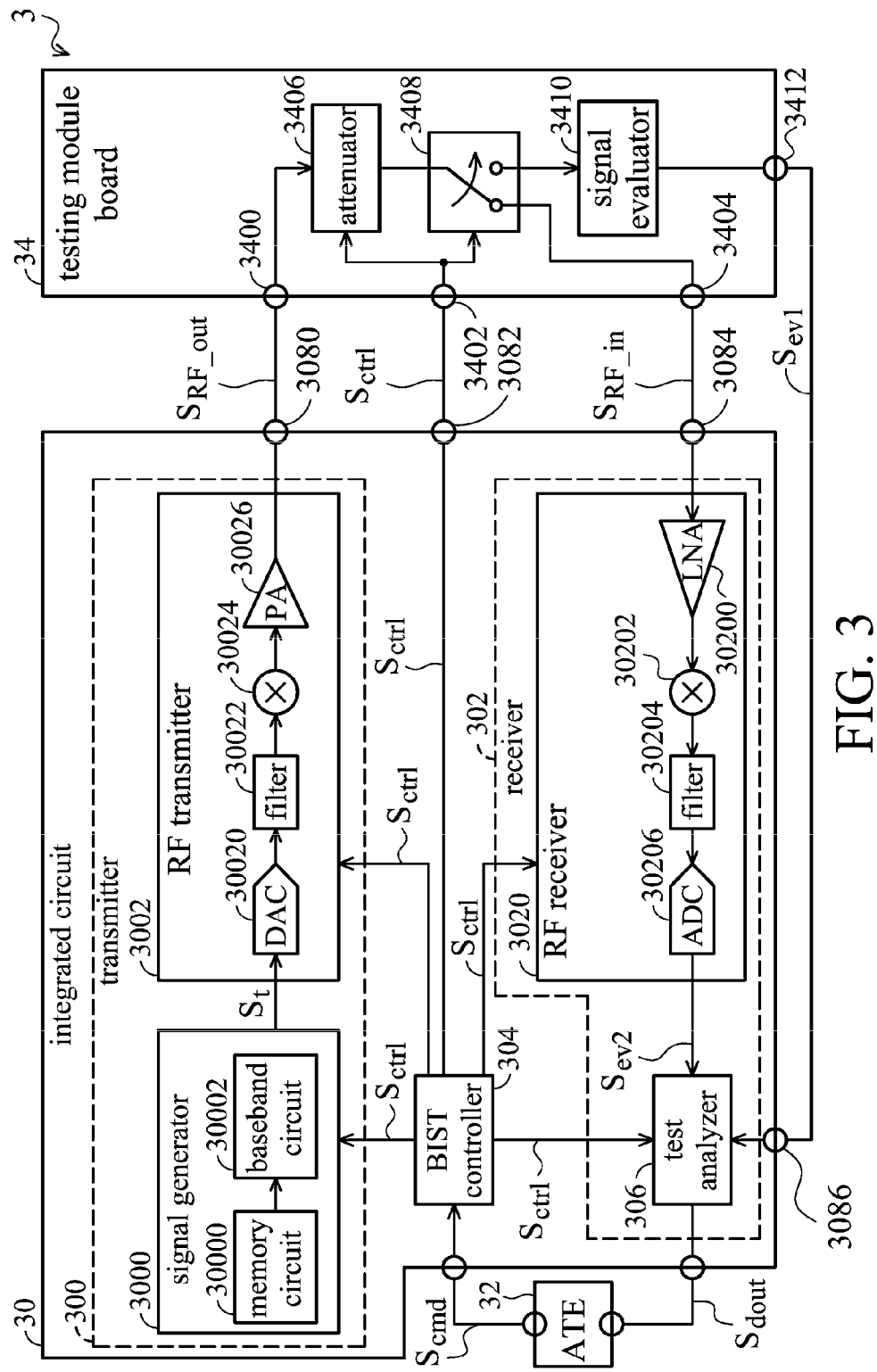
FIG. 3 is a block diagram of an RF BIST system 3 according to another embodiment of the invention.

FIG. 3 shows a block diagram of an RF BIST system 3 according to an embodiment of the invention, comprising an IC 30, an ATE 32, and a testing module board 34. The ATE 32 carries out an RF BIST by initiating a baseband command signal $S_{cmd}$ to the IC 30. In response, the IC 30 enters a test mode and generates a test pattern signal $S_t$ internally. The test pattern $S_t$ is sent to a RF transmitter 3002 to undergo various analog circuit passing in the transmitter path, rendering an outgoing RF signal $S_{RF\_out}$, which is further sent to the testing module board 34 to perform signal analysis. The testing module board 34 exhibits two configurations in the embodiment, one configuration performs signal analysis on the outgoing RF signal $S_{RF\_out}$ to produce a first evaluation signal $S_{ev1}$, and the other configuration loops the outgoing RF signal $S_{RF\_out}$ back to a receiver 302 in the IC 30. Since the outgoing signal $S_{RF\_out}$ is RF signal passing analog circuits in the transmitter path, it bears information on the circuit elements. In the signal analysis configuration, the testing module board 34 can evaluate electrical characteristics of the target circuit element based on the outgoing RF signal $S_{RF\_out}$ to output a first baseband evaluation signal $S_{ev1}$, which is further reported back to the IC 30. Based on the first evaluation signal $S_{ev1}$, the IC 30 then determines and reports a test result signal $S_{dout}$ back to the ATE 32, informing the ATE 32 whether the DUT has passed or failed the test. In the loopback configuration, the outgoing RF signal $S_{RF\_out}$ is transferred to the receiver 302 to undergo RF impairments in a receiver path, outputting a second baseband evaluation signal $S_{ev2}$ to the test result analyzer 306. The second baseband evaluation signal $S_{ev2}$ can be used by the test result analyzer 306 to determine electrical characteristics and functional validity of a receiver circuit element on the receiver path. The command signal $S_{cmd}$ and the test result signal $S_{dout}$ are baseband signals that are at a frequency substantially close to zero, and may be in digital or analog form.

The IC 30 comprises a transmitter 300, a receiver 302, and a BIST controller 304. The transmitter 300 and the receiver 302 may belong to the same or different transceiver systems. For examples, the transmitter 300 and the receiver 302 may both belong to a WLAN system, or may belong to a WLAN system and a Bluetooth system respectively. The transmitter 300 further comprises a signal generator 3000 and a RF transmitter 3002. In some implementations, the signal generator 3000 comprises a memory 30000 that keeps various test patterns for BISTs therein and a baseband circuit 30002 that performs digital power control (not shown) and/or digital compensations (not shown) such as in-phase/quadrature (IQ) mismatch and digital pre-distortion. The RF transmitter 3002 comprises a DAC 30020, a filter 30022, a modulator 30024, and a PA 30026. Similarly, the RF receiver 3020 comprises an LNA 30200, a demodulator 30202, a filter 30204, and an ADC 30206. The modulator 30024 and demodulator 30202 may further receive carrier signals from one or more local oscillators (not shown) to modulate and demodulate the outgoing and incoming RF signals respectively. Upon receiving the command signal $S_{cmd}$, the BIST controller 304 enables relevant circuit elements in IC 30 including the signal generator 3000, the RF transmitter 3002, the test result analyzer 306, and the RF receiver 302 to enter into the test mode and control the external circuit components in testing module board 34 including adjustable attenuator and switch. In some implementations, a digital filter is present between the ADC 30206 and the test result analyzer 306. In some implementations, the BIST controller 304 also controls the testing module board 34 to operate under the test mode. The test signal generator 3000 is arranged to generate the test signal $S_t$ in response to the command signal $S_{cmd}$. After test signal $S_t$ is fed into the RF transmitter 3002, the RF transmitter 3002 is arranged to generate the response signal $S_{RF\_out}$. The test result analyzer 306 may be implemented by a digital signal processing (DSP) unit or hardware circuits, and arranged to determine and report the test result signal $S_{dout}$ to the ATE 32. The test result signal $S_{dout}$ is determined based on the first evaluation signal $S_{ev1}$ and processed results of the second evaluation signal $S_{ev2}$. Specifically, in some implementations, the test result signal $S_{dout}$ is determined based on a first evaluation signal $S_{ev1}$ derived from the RF signal $S_{RF\_out}$. In other implementations, the test result signal $S_{dout}$ is determined based on the second evaluation signal $S_{ev2}$ which is derived by feeding back the response signal $S_{RF\_out}$ to the RF receiver 3020.

The IC 30 comprises a first communication port 3080, a second communication port 3082, a third communication port 3084, and a fourth communication port 3412 for communication with the testing module board 34. The first communication port 3080 outputs the outgoing RF signal $S_{RF\_out}$ to the testing module board 34 and the third communication port 3084 acquires the incoming RF signal $S_{RF\_in}$ from the testing module board 34. In addition, the two ports 3080 and 3084 need enough isolation for self-test. Consequently the two ports 3080 and 3084 cannot be implemented by a common communication port on the IC 30. The IC 30 directs the control signal $S_{ctrl}$ through the second communication port 3082 to control the testing module board 34. The fourth communication port 3086 receives the results of signal evaluator 3410 from the testing module board 34.

The testing module board 34 is external to the IC 30 and ATE 32, and comprises an input port 3400, a control port 3402, a loopback port 3404, an adjustable attenuator 3406, a switch 3408, and a signal evaluator 3410 which can be implemented by a power detector, and an output port 3412. In some implementations, a testing load board (not shown) is provided to hold the testing module board 34 and the IC 30 together. The testing load board may comprise an IC socket (not shown) to accept the IC 30 and a module slot (not shown) to hold the testing module board 34 in place during the test. The input port 3400 accepts the response RF signal $S_{RF\_out}$ from the IC 30. The control port 3402 receives the control signal $S_{ctrl}$ from the IC 30 to enable the testing module board 34 work under the test mode. The control signal $S_{ctrl}$ controls the attenuator 3406 and the switch 3408. The attenuator 3406 receives controls by the control signal $S_{ctrl}$ to adjust attenuation level to the RF signal $S_{RF\_out}$. The switch 3408 is selected by the control signal $S_{ctrl}$ to switch between the signal analysis configuration and the loopback configuration. In the signal analysis configuration, the transmitter response signal $S_{RF\_out}$ is transferred to the signal evaluator 3410 to determine a power level or a baseband signal thereof as the first evaluation signal $S_{ev1}$, which is reported back to the IC 30 through the output port 3412. In the loopback configuration, the transmitter output signal $S_{RF\_out}$ is looped back through the attenuator 3406 as an input RF signal $S_{RF\_in}$ to the RF receiver 3020 for a further test in the receiver path. In the receiver, the input RF signal $S_{RF\_in}$ is down-converted into the baseband, which is digitized into digital words that are processed by a baseband circuit or DSP.

Although the testing module board 34 accepts the control signal $S_{ctrl}$ from the IC 30, it should be appreciated by the people skilled in the art that the testing module board 34 can also receive controls from the ATE 32 or provide the control signal by the testing module board 34 locally without deviating from the principle of the invention.

In comparison to the conventional RF test mechanism, the present embodiment depicts an RF BIST system where the ATE 32 is only used to initiate the test and keep the test results. The other RF BIST tasks include test pattern generation, signal analysis, and test result justification, is controlled by the IC 30 and shifted to either the IC 30 or the testing module board 34, leading to a reduction in circuit complexity of the ATE 22, thereby decreasing design and manufacturing cost. Only low-frequency command signal $S_{cmd}$ and test result signal $S_{dout}$ are exchanged between the IC 30 and the ATE 32.

Figure 4:
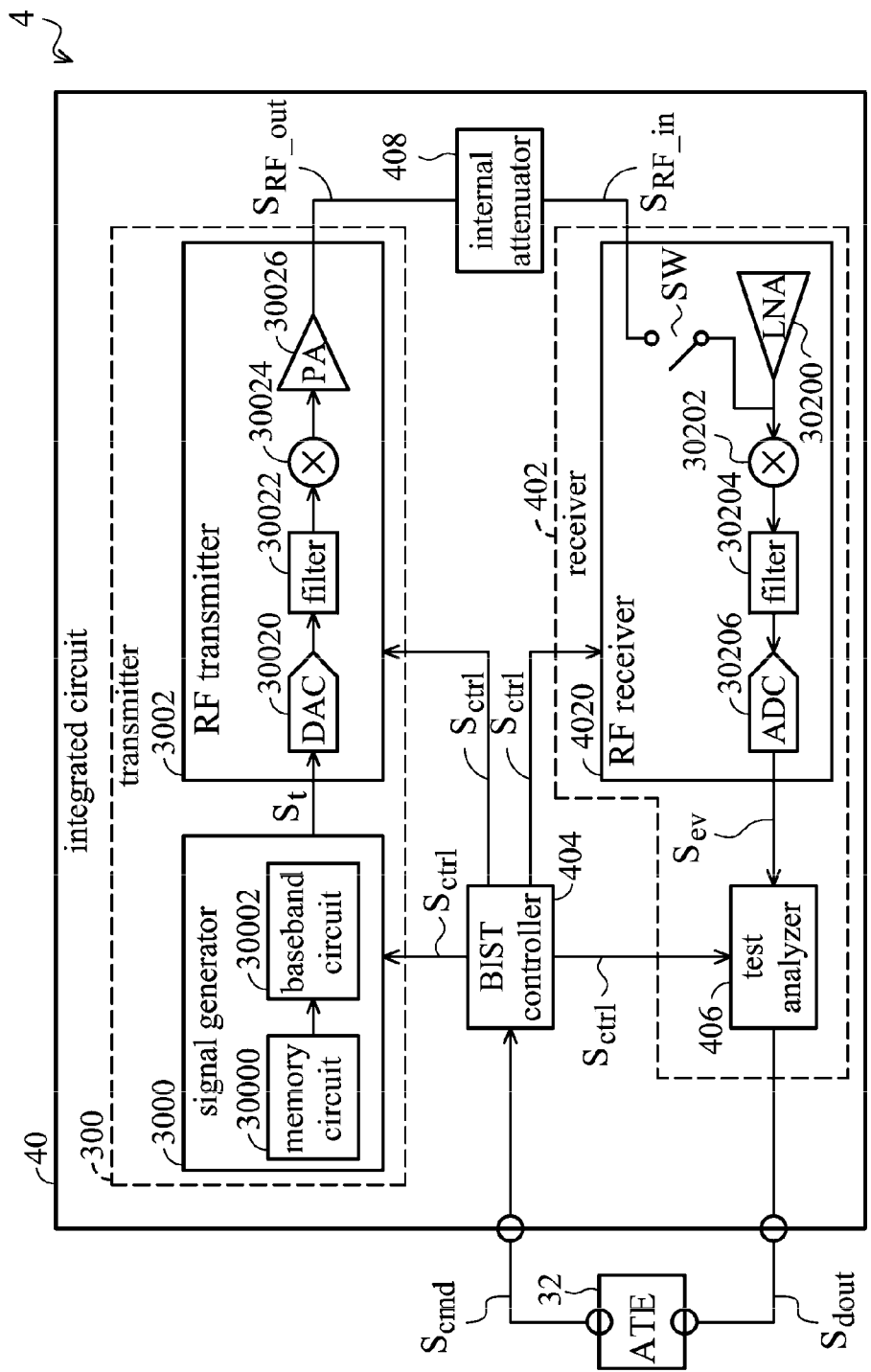
FIG. 4 is a block diagram of an RF BIST system 4 according to another embodiment of the invention.

FIG. 4 is a block diagram of an RF BIST system 4 according to another embodiment of the invention, comprising an integrated circuit 40 and the ATE 32. The circuit configuration in FIG. 4 is identical to that in FIG. 3 except that the outgoing RF signal $S_{RF\_out}$ is looped back through an internal attenuator 408 between the output of the RF transmitter 3002 and the input of RF receiver 4020, such that the signal performance of the RF transmitter 3002 and RF receiver 4020 can be evaluated without uses of the external testing module board 34 in FIG. 3. Upon being triggered by the command signal $S_{cmd}$, the IC 40 is able to run the RF BIST procedure all by itself to evaluate performance of a selected circuit element or a selected circuit path, and report the RF BIST result back to the ATE 32, without aids from any external circuitry.

The RF BIST is performed at a system level, where the transmitter 300 and receiver 402 belong to a same system. The ATE 32 issues the command signal $S_{cmd}$ to the IC 40 to start the test. In response to the command signal $S_{cmd}$, the BIST controller 404 is initialed to enable the test mode and control the RF BIST processes. The signal generator 3000 produces the corresponding test pattern $S_t$, which is processed through the RF transmitter 3002 and the input of RF receiver 4020 to render the evaluation signal $S_{ev}$. The different test patterns $S_t$ can easily be generated by the implementation of signal generator 3000 in the IC 40 to accommodate different test items. Hence, utilizing the test analyzer 406 the quality of the RF transceiver in IC 40 can be evaluated by processing the signal $S_{ev}$ to determine the test result, good or bad, of IC 40 and report the result to the ATE 32. The IC 40 provides the loopback attenuator 408 to loop back the RF signal $S_{RF\_out}$ from the RF transmitter 3002 to RF receiver 4020, thereby eliminating the uses of the testing module board 34 while still able to carry out the most RF BIST processes in the IC 40. Similar to the RF BIST system 3, the RF BIST system 4 utilizes low-frequency communication between the ATE 32 and IC 40, offering a cost reduction in the ATE 32.

Figure 5:
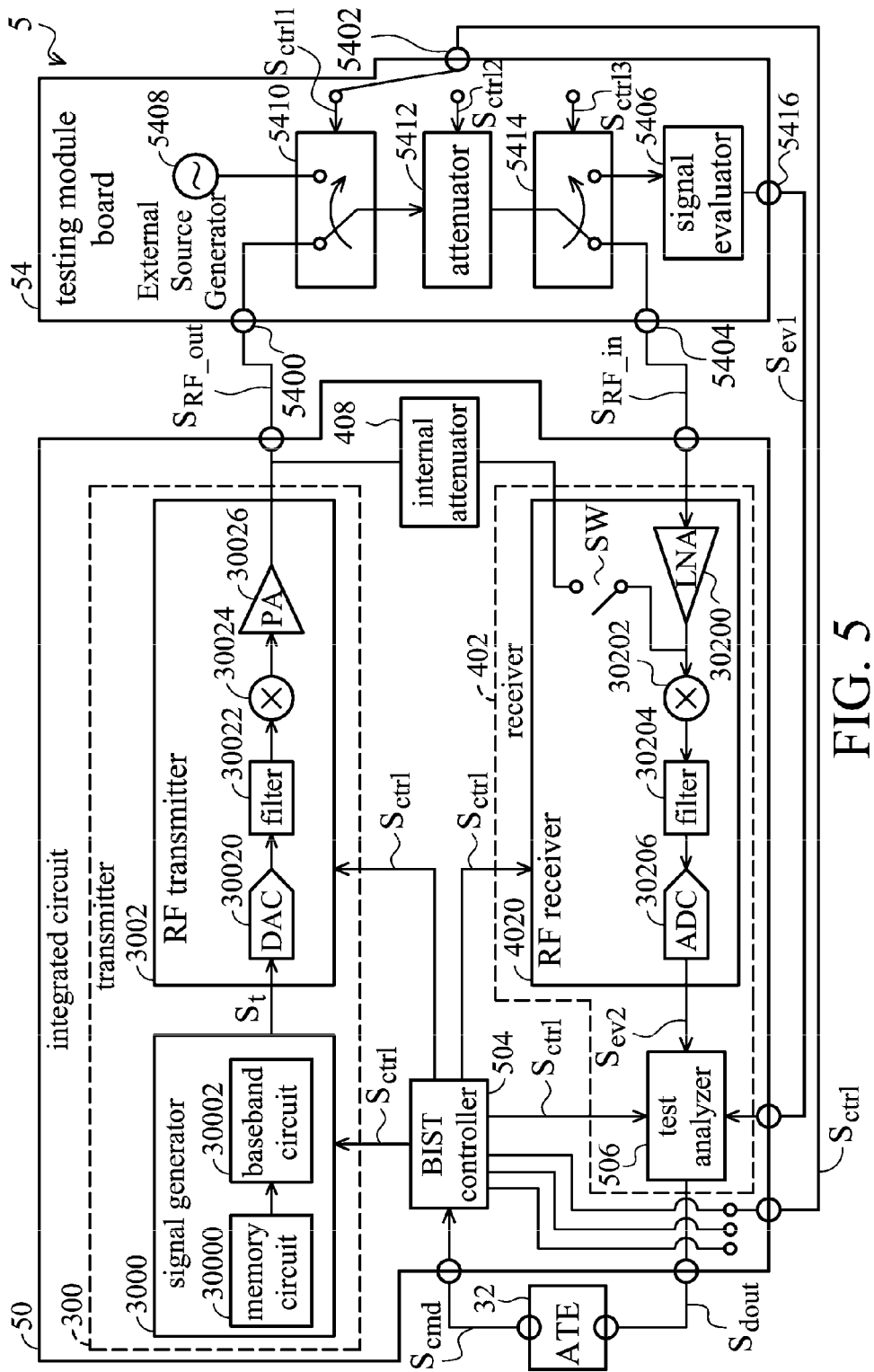
FIG. 5 is a block diagram of an RF BIST system 5 according to yet another embodiment of the invention.

FIG. 5 is a block diagram of an RF BIST system 5 according to yet another embodiment of the invention, comprising an IC 50, an ATE 32, and a testing module board 54. The circuit configuration in FIG. 5 is identical to that in FIG. 4 except that the testing module board 54 is connected to the IC 50. The testing module board 54 is external to the IC 50 and the ATE 32 and comprises circuit elements customized to assist signal analysis of the outgoing RF signal $S_{RF\_out}$, thereby determining the first evaluation signal $S_{ev1}$ indicative of an electrical characteristic of the $S_{RF\_out}$. The testing module board 54 receives control externally from either the IC 50 or the ATE 32. The embodiment in FIG. 5 depicts the case where the testing module board 54 receives a control signal $S_{ctrl}$ from the IC 50 to select performing signal analysis on the transmitter path, or looping the RF signal $S_{RF\_out}$ back to the receiver path, or performing other testing initiated by or measured by the testing module board 54.

The testing module board 54 comprises an input port 5400, a control port 5402, a loopback port 5404, a signal evaluator 5406, an external source generator 5408, a first switch 5410, an attenuator 5412, a second switch 5414, and an output port 5416. The input port 5400 is configured to receive the output RF signal $S_{RF\_out}$ that carries information of the DUT on the transmitter path. In some embodiments, the input port 5400 and loopback port 5404 of the testing module board 54 are implemented by separated ports while the RF transmitter 3002 and RF receiver 4020 on the IC 50 respectively transmit and receive RF signals by separate ports. In other embodiments, the input port 5400 and the loopback port 5404 can be realized by a common port while the RF transmitter 3002 and RF receiver 4020 on the IC 50 respectively transmit and receive RF signals by another common port. The signal evaluator 5406 is configured to be controlled by an external controller, either by the IC 50 or the ATE 32, to evaluate the outgoing RF signal $S_{RF\_out}$ to determine a first evaluation signal $S_{ev1}$ indicating an electrical characteristic of the first test result signal. In turn, the first evaluation signal $S_{ev1}$ is output to the IC 50 for a test result analysis through the output port 5416. In some implementations, the signal evaluator 5406 is a power detector monitoring power in the outgoing RF signal $S_{RF\_out}$. In other implementations, the signal evaluator 5406 is a component which includes one or more analog/digital circuit to convert the RF signal to baseband digital signal and sends the digital signal to IC 50 by output port 5416. The external source generator 5408 is configured to generate an RF test pattern that may be injected into the receiver path as a clear source or reference source in order to evaluate the RF receiver 4020. The first switch 5410 is configured to select one of the output signal $S_{RF\_out}$ generated by the IC 50 and the second test pattern generated by external source generator 5408 in the testing module board 54. The attenuator 5412 is configured to generate RF source with different signal levels. The second switch 5414 is configured to select one of performing signal analysis on the transmitter path and providing a test pattern to the receiver path. The testing module board 54 receives the control signal $S_{ctrl}$ from the BIST controller 504 to determine a function implemented thereon. In order words, the BIST controller 504 can respectively control at least one of the first switch 5410, the attenuator 5412 and the second switch 5414 by the control signal $S_{ctrl}$ via the control port 5402.

Although the IC 50 incorporates a transmitter path circuitry and a receiver path circuitry, the person in the art will recognize that the RF BIST therefore may be carried out separately according to the principle of the invention. In some implementations, the IC 50 performs a test only on the transmitter path circuitry, so that the testing module board 54 can evaluate the electrical characteristics of the signature response $S_{RF\_out}$ of the transmitter path to output the evaluation signal $S_{ev1}$ to the test result analyzer 506. In other implementations, the IC 50 performs a test only on the receiver path circuitry, the testing module board 54 assists to provide the test pattern from source generator 5408 to be injected into the RF receiver 4020 to output the evaluation signal $S_{ev2}$ to the test result analyzer 506 for receiver tests such as receiver gain, IQ mismatch, DC offset, and nonlinearity, etc.

The RF BIST system 5 provides the customized testing module board 54, capable of evaluating the signal properties for the response signal $S_{RF\_out}$ of the RF transmitter 3002 and generating a RF test pattern to be injected into the RF receiver 4020, thereby assisting the test signal generation and signal evaluation in the RF BIST processes. Similar to the RF BIST system 3, the RF BIST system 5 utilizes low-frequency communication between the ATE 32 and IC 50, resulting in a cost reduction in the ATE 32.

Figure 6:
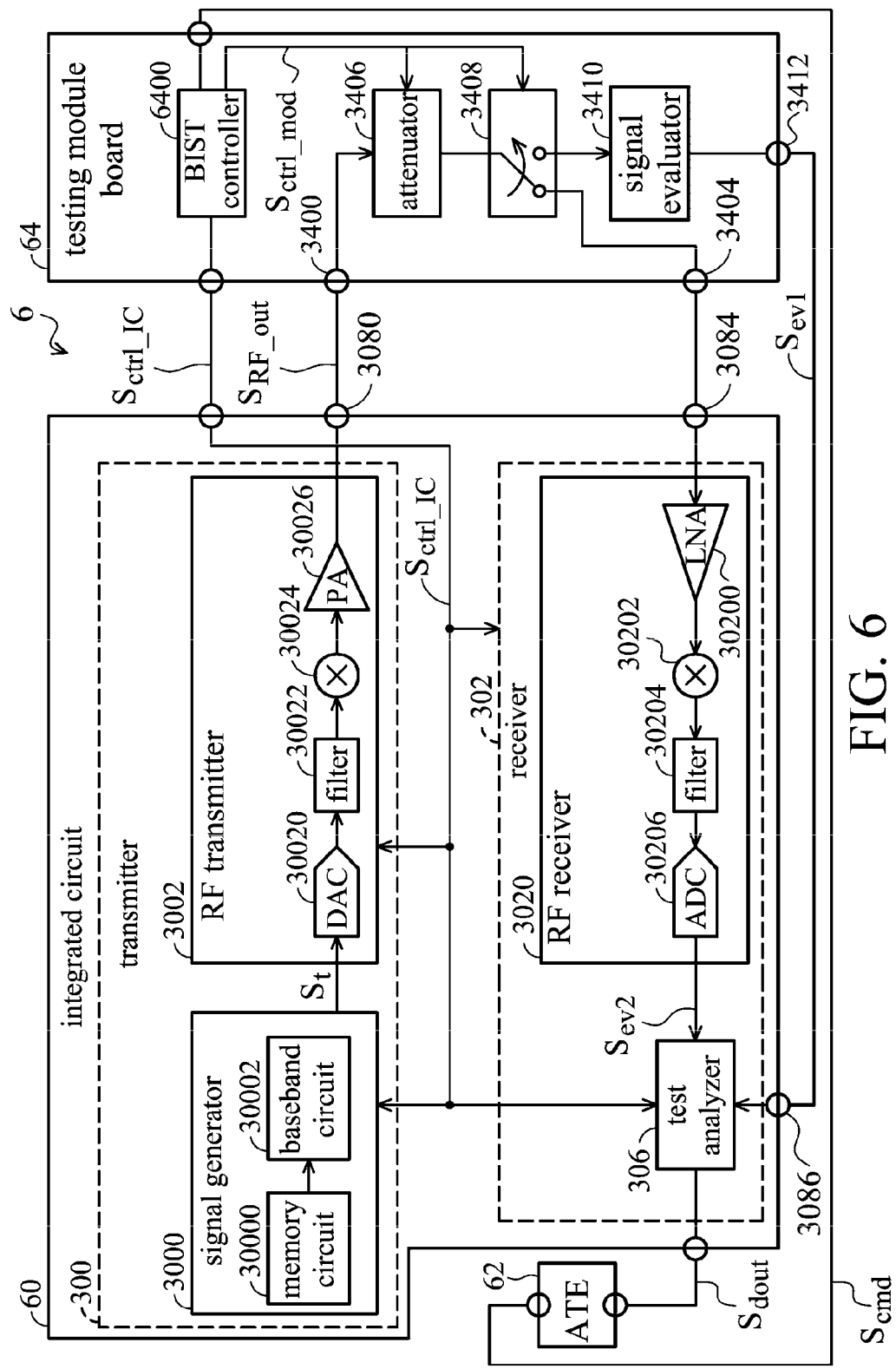
FIG. 6 is a block diagram of an RF BIST system 6 according to still yet another embodiment of the invention.

FIG. 6 is a block diagram of an RF BIST system 6 according to still yet another embodiment of the invention, comprising an integrated circuit 60, an ATE 62, and a testing module board 64. The ATE 62 identical to the ATE 22 and ATE 32 in FIG. 2 and FIG. 3, reference therefor is detailed in the preceding paragraphs. The circuit configuration and connection is identical to that in the RF BIST system 3, except that in the RF BIST system 6, a BIST controller 6400 is placed at the testing module board 64, so that the RF test control can be adapted and managed externally from the IC 60. In the embodiment, the testing module board 64 comprises the BIST controller 6400 which receives a command signal $S_{cmd}$ from the ATE 62 for initiating an RF BIST. Instead of controlling the RF BIST procedure from the IC, the BIST controller 6400 oversees all RF BIST operations occurring in the IC 60 by an IC control signal $S_{ctrl\_IC}$, and controls RF BIST operations in the testing module board by a module control signal $S_{ctrl\_mod}$. Upon receiving the command signal $S_{cmd}$, through the IC control signal $S_{ctrl\_IC}$, the BIST controller 6400 controls the signal generator 3000 to produce a test pattern $S_t$ for a corresponding RF BIST for the transmitter path or the loopback path and enables the test pattern $S_t$ to pass through the RF transmitter 3002 and output an RF output signal $S_{RF\_out}$ to the testing module board 64. The BIST controller 6400 also controls the circuit blocks in the testing module board to perform relevant RF BIST operations. In the embodiment, using the module control signal $S_{ctrl\_mod}$, the BIST controller 6400 enables the attenuator 3406 to change a power level of the received RF output signal $S_{RF\_out}$, or controls the switch 3408 to switch between the signal evaluator 3410 for performing power detection test and/or the loopback path to the IC 60 for performing the BIST for the receiver path of the receiver 302. The BIST controller 6400 may further control the test analyzer 306 in the IC 60 via the IC control signal $S_{ctrl\_IC}$ to perform test analysis on RF BIST using the first evaluation signal $S_{ev1}$ from the testing module board 64, or using the second evaluation signal $S_{ev2}$ from the receiver 302. Followed by the test analysis, the test analyzer 306 may direct the test result $D_{dout}$ back to the ATE 62 and proceed for the next test.

Figure 7:
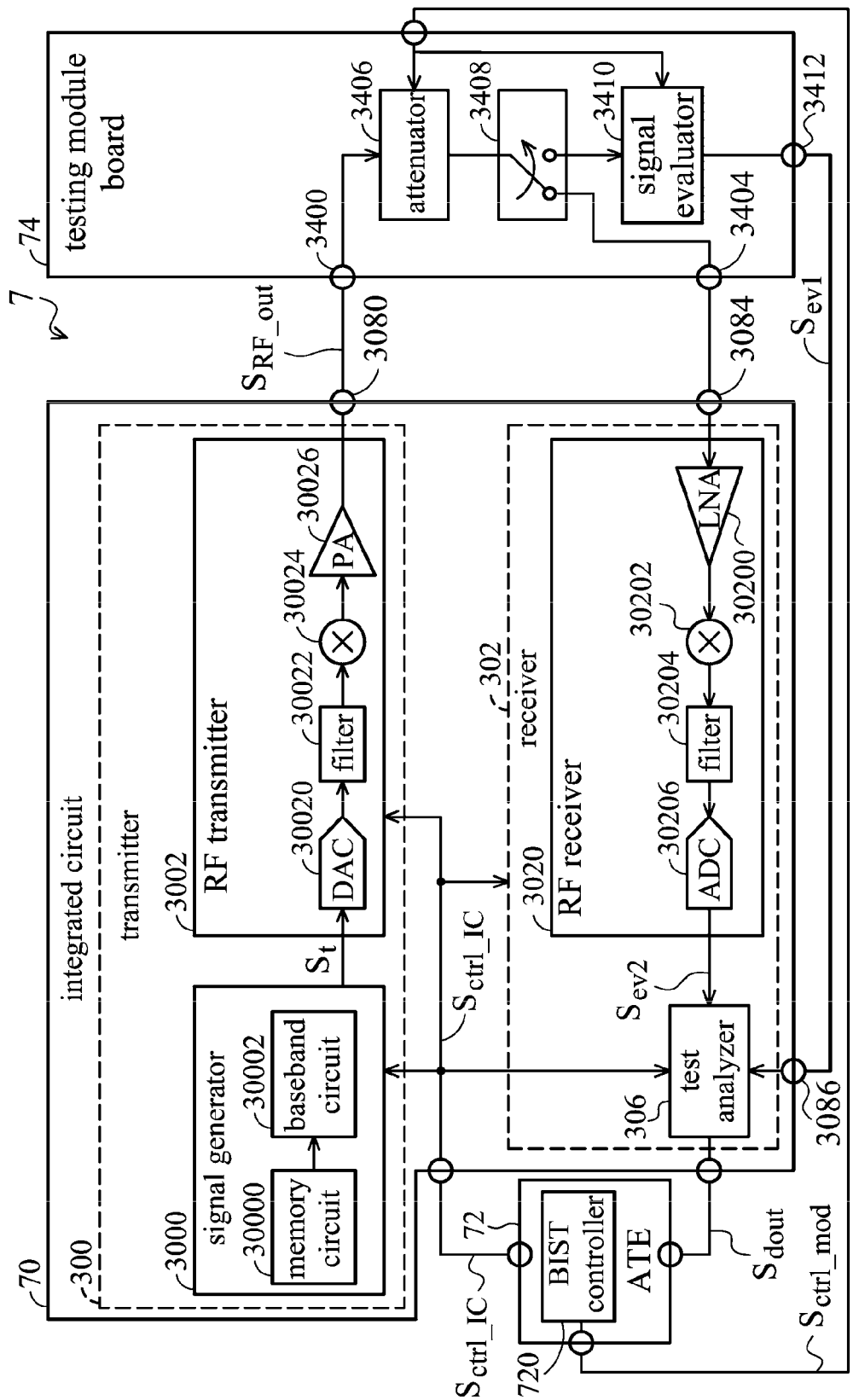
FIG. 7 is a block diagram of an RF BIST system 7 according to yet another embodiment of the invention.

FIG. 7 is a block diagram of an RF BIST system 7 according to yet another embodiment of the invention, comprising an integrated circuit 70, an ATE 72, and a testing module board 74. The testing module board 74 identical to the testing module board 34 FIG. 3, reference therefor is detailed in the preceding paragraphs. The circuit configuration and connection is identical to that in the RF BIST system 3, except that in the RF BIST system 7, a BIST controller 720 is provided at the ATE 72. In the embodiment, the IC 70 and the testing module board 74 receive test controls from the ATE 72, thus no command signal $S_{cmd}$ is required to initiate an RF BIST. The BIST controller 720 manages all RF BIST operations in the IC 70 by an IC control signal $S_{ctrl\_IC}$, and controls all RF BIST operations in the testing module board 74 by a module control signal $S_{ctrl\_mod}$. Through the IC control signal $S_{ctrl\_IC}$, the BIST controller 720 controls the signal generator 3000 to produce a test pattern $S_t$ for a corresponding RF BIST for the transmitter path or the loopback path and enables the test pattern $S_t$ to pass through the RF transmitter 3002 and output an RF output signal $S_{RF\_out}$ to the testing module board 74. Through the module control signal $S_{ctrl\_mod}$, the BIST controller 720 controls the attenuator 3406 to change power level of the received RF output signal $S_{RF\_out}$, or controls the switch 3408 to switch between the signal evaluator 3410 for performing power detection test and/or the loopback path to the IC 70 for performing the BIST for the receiver path of the receiver 302. The BIST controller 720 may further control the test analyzer 306 in the IC 70 via the IC control signal $S_{ctrl\_IC}$ to perform test analysis on RF BIST using the first evaluation signal $S_{ev1}$ from the testing module board 74, or the second evaluation signal $S_{ev2}$ from the receiver 302. Followed by the test analysis, the test analyzer 306 may report the test result $S_{dout}$ back to the ATE 62 and proceed for the next test.

As used herein, the term "determining" encompasses calculating, computing, processing, deriving, investigating, looking up (e.g., looking up in a table, a database or another data structure), ascertaining and the like. Also, "determining" may include resolving, detecting, selecting, choosing, establishing and the like.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit (IC), comprising: a test signal generator, arranged to generate a test signal in response to a command signal from an external test equipment, wherein the command signal informs the IC of a type of built-in-self-test (BIST) to perform, and wherein the test signal comprises a predetermined test pattern loaded according to the command signal; a transmitter, arranged to generate a radio frequency (RF) signal according to the test signal; and a test result analyzer, arranged to determine a test result by the RF signal, and report the test result to the external test equipment.

2. The IC of claim 1, further comprises a test controller, arranged to switch the test signal generator, the transmitter, and the test result analyzer to operate between a test mode and a normal operation mode.

3. The IC of claim 1, wherein:
   the transmitter is arranged to transmit the RF signal to a module circuitry external to the IC;
   the test result analyzer is arranged to receive an evaluation signal indicative of an electrical characteristic of the RF signal from the module circuitry, and generate the test result according to the evaluation signal; and
   the module circuitry is different from the external test equipment.

4. The IC of claim 1, further comprising a receiver, arranged to receive the RF signal.

5. The IC of claim 4, wherein the transmitter and the receiver belong to a same transceiving system.

6. The IC of claim 4, wherein the transmitter and the receiver belong to different transceiving systems.

7. An integrated circuit (IC), comprising:
   a controller, arranged to make the IC enter a test mode in response to a command from an external test equipment, wherein the controller is further arranged to control a module circuitry external to the IC and separate from the external test equipment;
   a transmitter, arranged to generate a radio frequency (RF) signal under the test mode and transmit the RF signal to the module circuitry;
   a receiver, arranged to receive RF signal from the module circuitry under the test mode;
   a test result analyzer, arranged to determine a test result by the RF signal, and report the test result to the external test equipment.

8. The IC of claim 7, wherein the transmitter and the receiver belong to a same transceiving system.

9. The IC of claim 7, wherein the transmitter and the receiver belong to different transceiving systems.

10. The IC of claim 7, wherein the receiver is arranged to receive the RF signal from a module circuitry external to the IC, wherein the module circuitry is different from the external test equipment.

11. The IC of claim 7, wherein when under the test mode:
the receiver is arranged to receive the RF signal to output an evaluation signal to the test result analyzer;
the test result analyzer is arranged to generate the test result according to the evaluation signal; and
the test result indicates whether the receiver has passed the test.

12. A module circuitry, communicating with an integrated circuit (IC), comprising:
an input port, configured to receive a radio frequency (RF) signal from the integrated circuit;
a signal evaluator, configured to be controlled by an external controller embedded in the IC, and evaluate the RF signal to generate an evaluation signal indicating an electrical characteristic of the RF signal, wherein the external controller is coupled to an external test equipment, the external test equipment being external to the module circuitry; and
an output port, configured to output the evaluation signal to the integrated circuit.

13. The module circuitry of claim 12, further comprising:
a test signal generator, configured to generate a self-test signal at the RF frequency,
wherein the output port is further configured to output the self-test signal to the IC to perform a test thereon.

14. A radio frequency (RF) built-in-self-test (BIST) system, comprising: a test equipment; a module circuitry; and an integrated circuit (IC), arranged to communicate with the module circuitry by an RF signal in response to a command signal from the test equipment, wherein the command signal informs the IC of a type of built-in-self-test (BIST) to perform, and wherein the RF signal is generated based on a predetermined test pattern loaded according to the command signal, the IC being further arranged to determine a test result by the RF signal, and report the test result to the test equipment, wherein the module circuitry is external to the IC and the test equipment.

15. The RF BIST system of claim 14, wherein the IC further comprises:
a compensator, arranged to compensate the IC based on evaluation data, wherein the evaluation data is indicative of an electrical characteristic of the RF signal.

16. The RF BIST system of claim 14, wherein the IC further comprises:
a transmitter, arranged to generate the RF signal in response to the command signal; and
a test result analyzer, arranged to receive evaluation data indicative of an electrical characteristic of the RF signal from the module circuitry, and generate the test result according to the evaluation signal.

17. The RF BIST system of claim 14, wherein the IC further comprises:
a receiver, configured to receive the RF signal to generate evaluation data, and
a test result analyzer, configured to generate the test result indicating whether the receiver has passed the test according to the evaluation data.

* * * * *